(12) United States Patent
Burns

(10) Patent No.: US 6,292,760 B1
(45) Date of Patent: Sep. 18, 2001

(54) METHOD AND APPARATUS TO MEASURE NON-COHERENT SIGNALS

(75) Inventor: Mark Burns, McKinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/132,182

(22) Filed: Aug. 11, 1998

Related U.S. Application Data
(60) Provisional application No. 60/055,414, filed on Aug. 11, 1997.

(51) Int. Cl.[7] .................................................. H04L 27/00
(52) U.S. Cl. .......................... 702/189; 702/75; 702/77; 702/109; 702/196; 324/76.19; 324/76.21; 375/325
(58) Field of Search ........................................ 702/189, 108, 702/109, 75–77, 196, 194, 112; 324/76.19, 76.24, 76.21; 375/329, 344, 371, 325

(56) References Cited

U.S. PATENT DOCUMENTS

| | | | | |
|---|---|---|---|---|
| 4,417,337 | * | 11/1983 | Favin et al. | 702/108 |
| 4,466,108 | * | 8/1984 | Rhodes | 375/329 |
| 5,995,914 | * | 11/1999 | Cabot | 702/109 |

* cited by examiner

Primary Examiner—Marc S. Hoff
Assistant Examiner—Hien Vo
(74) Attorney, Agent, or Firm—Wade James Brady, III; Frederick J. Telecky, Jr.

(57) ABSTRACT

A method of measuring non-coherent electrical signals using either windowed or non-windowed digital signal processing. The method includes the steps of providing a digitized version of the non-coherent electrical signal; generating a matrix A of correlations between sine and cosine components of known correlation frequencies and sine and cosine components of signal frequencies; generating an inverse matrix $A^{-1}$ of the correlation matrix; generating a second matrix B of correlations between sine and cosine components of the correlation frequencies and the digitized non-coherent electrical signal; and generation of a third matrix C which represents the measured amplitudes of the sine and cosine components of the non-coherent electrical signal.

18 Claims, 2 Drawing Sheets

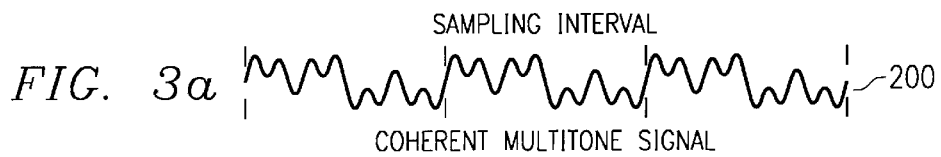
FIG. 3a COHERENT MULTITONE SIGNAL
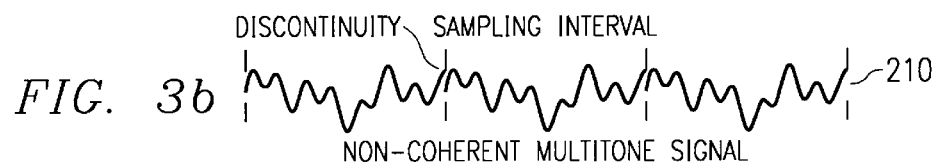
FIG. 3b NON-COHERENT MULTITONE SIGNAL
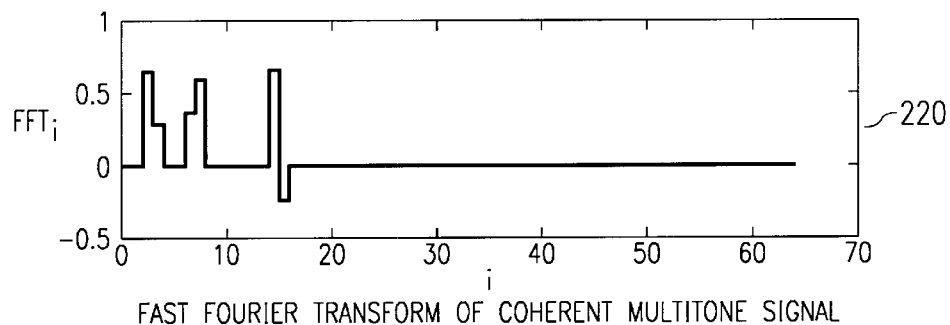
FAST FOURIER TRANSFORM OF COHERENT MULTITONE SIGNAL
FIG. 4a
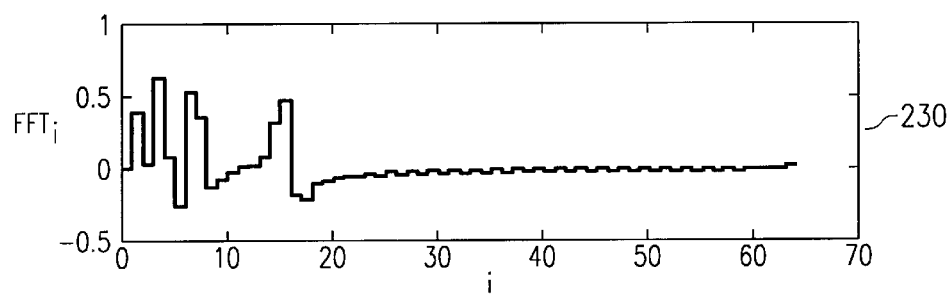
FAST FOURIER TRANSFORM OF NON-COHERENT MULTITONE SIGNAL
FIG. 4b
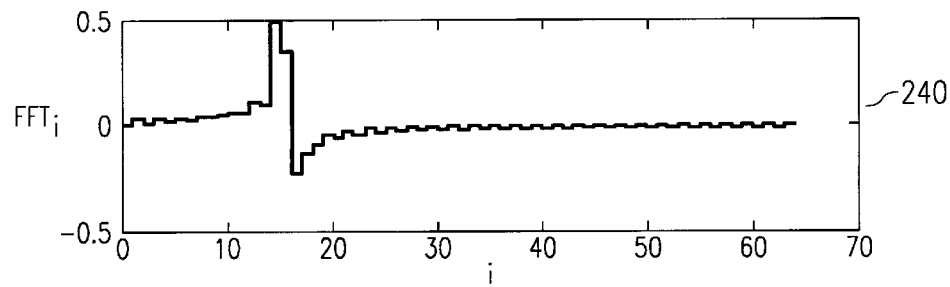
FAST FOURIER TRANSFORM OF NON-COHERENT SINGLE TONE SIGNAL FREQUENCY=Ffx7.3
FIG. 5

METHOD AND APPARATUS TO MEASURE NON-COHERENT SIGNALS

This application claims priority under 35 USC § 119(e)(1) of provisional application No. 60/055,414 filed Aug. 11, 1997.

BACKGROUND AND SUMMARY OF THE INVENTION

This invention relates in general to the field of test system engineering, and more particularly to a method and system utilizing digital signal processing for measuring non-coherent electrical signals.

BACKGROUND

Test engineering is an important and constantly growing area of engineering practice especially in the field of integrated circuit design. The test engineer is ideally involved in the development cycle of a device from start to finish and provides valuable insight on the performance of the device. Many test and measurement systems rely *on Digital Signal Processing (DSP) to make fast and accurate measurements of electrical signals. Fast measurements are critically important in minimizing the cost of production test of electronic circuits and systems.

Fourier Frequency and Fourier Transforms

The most accurate DSP based test systems rely on coherence between the sampling rate of the test system and the signal under test. In a coherent sampling system, a limited number of samples of the signal under test are collected at regular time intervals. The Fourier frequency $F_f$ is defined as the sampling rate divided by the number of samples collected. Most common test signals consist of a summation of one or more sine and cosine waves, also known as test tones. If each frequency in such a multitone test signal is an integer multiple of the Fourier frequency, then the test signal is referred to as a coherent signal.

The Discrete Time Fourier Transform (DTFT) is based on a series of correlations between the signal under test and sine/cosine pairs at integer multiples of the Fourier frequency. The results of the correlations are shown in a plot of signal amplitude vs. frequency, and is equivalent to a spectrum analyzer.

The Fast Fourier Transform (FFT) is a mathematically efficient way to perform the full DTFT using many fewer operations, and is therefore an equivalent of a spectrum analyzer that is sensitive to both magnitude and phase. The FFT turns time information into frequency information, if the number of samples N is a power of two. The FFT will allow the evaluation of (N/2)−1 sin/cosine pairs.

Both the DTFT and FFT assume that all signal components are coherent. If they are not, significant errors arise, as described below.

The Fourier transform of a coherent sampled signal results in a spectrum with a very desirable property: each sine or cosine component falls into its own unique mathematical array element. The individual array elements are known as Fourier bins or spectral bins. Since each test frequency falls into a unique spectral bin, it is possible to measure multiple frequencies simultaneously, which significantly reduces test time.

Coherence

One characteristic of a coherent signal is that the endpoints of the signal transition smoothly from one period to the next. In a coherent signal, each frequency component of the output signal falls into its own Fourier spectral bin. If there is a discontinuity in the endpoints, i.e. the signal does not transition smoothly from one period to the next, then the signal is non-coherent. In the case of a non-coherent signal, some of the energy level from each frequency component of the output signal "leaks" or "smears" into the other spectral bins, corrupting the other signal energy levels. For this reason, the FFT normally cannot be used on non-coherent signals without some form of pre-processing, i.e., windowing.

Coherent DSP-based testing results in several distinct disadvantages. First, the test tones must be integer multiples of the Fourier frequency. This restriction limits the frequency resolution of the measurement for a given sampling frequency and number of captured samples. In a coherent measurement system, the frequency resolution can only be increased by collecting more samples of the signal under test. The extra samples require a longer test time, which drives up the cost of test.

Second, coherent testing requires specific numerical ratios between the various sampling frequencies in a mixed analog/digital circuit and the sampling frequencies of the digitizer or digital waveform capture system in the measurement system. Often, these ratios of sampling frequencies cannot be achieved because of architectural restrictions in the measurement system.

Third, the accuracy of a coherent measurement is vulnerable to non-coherent interference tones, such as 60 Hz power hum. Such non-coherent tones are typically generated by external electrical equipment which is not synchronized to the sampling frequency of the measurement system. They can also be generated by parasitic oscillations in the circuit under test. Finally, there are certain types of circuits that generate their own signal frequencies. These signal frequencies cannot be synchronized to the measurement equipment sampling frequencies. In this case, a coherent measurement system cannot be achieved. Coherent and non-coherent multitone signals are illustrated in FIGS. 3a and 3b, respectively.

Windowing

In the prior art, a non-coherent signal requires the use of a mathematical window which is applied to the sampled signal before the Fourier transform is computed. Windowing "squeezes" the endpoints of the sampled signal towards zero, in effect forcing coherence (i.e., forcing the endpoints of the signal to wrap smoothly from one period to the next). Windowing is a well known technique in digital signal processing and in test engineering. Windowing is a digital signal processing technique of partitioning a long sequence into smaller subsections by multiplying the long sequence by a shorter sequence of non-zero values. For example, the sequence 8, 3, 6, 4, 1, 0, 4, 2, 3 windowed using the sequence 0, 0, 0.5, 1, 1, 1, 0.5, 0, 0 produces the sequence 0, 0 , 3, 4, 1, 0, 2, 0, 0. this example, both endpoints of the sample are forced to zero, which allows the signal to be tested as if it were truly coherent.

Windowing, however, has a well known side effect in that it introduces substantial error in the measured signal level. The error arises because windowing allows some of the energy at each frequency in the measured signal to spread into adjacent spectral bins. Because the signal energy from each test tone is allowed to spread into many spectral bins, the various test tones become indistinguishable from one another. Also, sine and cosine components of a given tone become mixed together, reducing the accuracy of phase measurements. This problem is most severe in sampled waveforms with a small number of samples, since there are relatively few spectral bins in the resulting Fourier transform. Another problem introduced by windowing is increased noise relative to the signal under test. Increased noise reduces the repeatability of a measurement. Repeatability can only be recovered by averaging or increasing the sample size. Either of these techniques adds a great deal of extra test time.

The presently preferred embodiment provides a means of measuring non-coherent multitone signal amplitudes and phase shifts without sacrificing accuracy and repeatability.

Innovative Method and Apparatus for Measuring Non-Coherent Signals

The preferred embodiment comprises a method and a system of measuring non-coherent single tone or multitone signals using either windowed or non-windowed Fourier transforms. Because the Fourier transform is mathematically equivalent to a series of correlation functions, windowed or non-windowed correlation functions can be used in place of the complete Fourier transform to save calculation time. Frequency resolution is infinite, rather than being limited to an integer multiple of the Fourier frequency $F_f$ of the sampling system. Furthermore, accuracy can be substantially improved when compared to the windowing process of the prior art.

BRIEF DESCRIPTION OF THE DRAWINGS

Additional features of the invention will be more readily apparent from the following detailed description and appended claims when taken in conjunction with the drawings in which:

FIGS. 3(a) and 3(b) show a coherent and a non-coherent multitone signal, respectively;

FIGS. 4(a) and 4(b) shows non-windowed Fast Fourier Transform (FFT) interpretations of the non-coherent signals of FIGS. 3(a) and 3(b), respectively; and FIG. 5 shows a non-windowed Fast Fourier Transform (FFT) of a single non-coherent test tone.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Fourier Measurements of Coherent Signals

Previous DSP-based measurement systems have relied on the use of coherent test frequencies, also known as test tones. A common practice in DSP-based testing is to add several discrete test tones together to form a multitone signal. Since summation of sine only or cosine only waves at various frequencies can result in a signal with a very high peak voltage relative to the root mean square (RMS) signal level, each test tone is given a pseudo random phase shift. The phase shifts maintain an acceptable peak to RMS ratio in the composite multitone signal. Since phase shift is equivalent to adding a sine component and a cosine component at the same frequency, the multitone signal can more generally be described as a summation of sine and cosine components at various test frequencies $Ft_1$, $Ft_2$, ... $Ft_n$.

Figure 2:
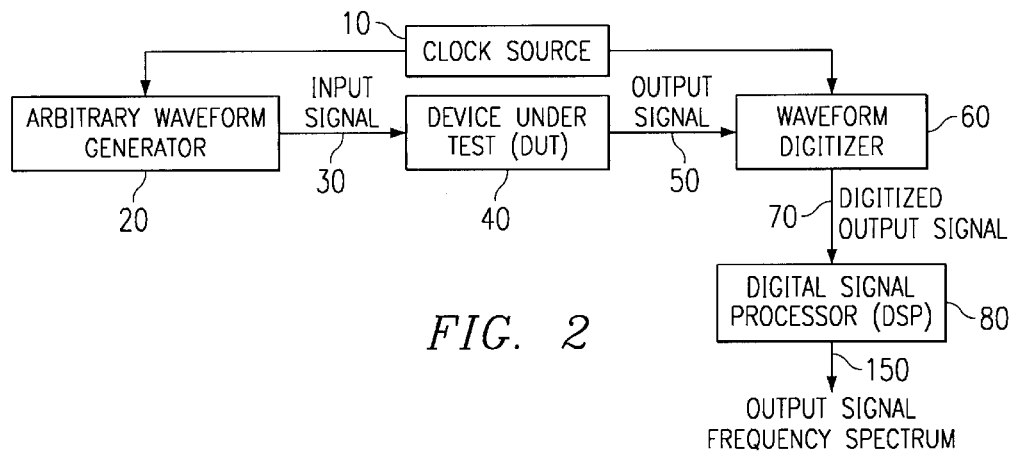
FIG. 2 is a block diagram of a digital signal processing based measurement system of the prior art.

A generic prior art DSP-based measurement system is shown in FIG. 2. The system consists of a clock source 10, an arbitrary waveform generator (AWG) 20, the device under test (DUT) 40, a waveform digitizer 60, and a Digital Signal Processor 80. A typical measurement system may be more complex, but the generic system of FIG. 2 is illustrative of the testing problem solved by the disclosed method.

The clock source 10 provides a common clock for the AWG 20 and the waveform digitizer 60. The common clock ensures that the frequency of the input signal at 30 into the DUT 40 is a known multiple of the frequency of the digitized output signal at 70 from the waveform digitizer 60.

The AWG 20 provides an input signal at 30 to the DUT 40. The input signal at 30 is typically a combination of several sine and cosine signals at various well defined frequencies and levels. This type of signal is called a multitone signal, or multiple tone signal. A signal comprising one sine and/or one cosine signal at a single frequency is called a single tone signal. The DUT 40 produces an output signal at 50, which should have spectral components at the same frequency or frequencies as the input signal at 30. The DUT 40 usually modifies the signal level at each frequency (introducing gain or attenuation) and may also add harmonic distortion and noise to the output signal at 50.

The waveform digitizer 60 samples the output signal at 50 at regular intervals, creating at 70 a numerical "plot" (or digitized output signal) of the DUT 40 output signal at 50. The DSP 80 then separates the digitized output signal at 70 into separate frequency components, or "spectral bins," so that the signal level at each frequency included in the output signal at 50 of the DUT 40 can be measured independently. This reduces test time in that all frequency components of the output signal at 50 can be measured in one reading. Furthermore, random noise not located at an input signal frequency is isolated, which improves repeatability of the measurement.

Once the digitized output signal at 70 of the electrical output signal at 50 of the DUT 40 is obtained, the DSP 80 calculations typically begin with a Fast Fourier Transform (FFT) of the digitized output signal at 70. The FFT converts the time domain signal into a frequency domain representation, or output signal frequency spectrum at 150. The FFT assumes that the signal to be transformed represents a segment of a repeating signal.

Coherence

If the endpoints of the signal transition smoothly from one period to the next, this is called a coherent signal. In a coherent signal, each frequency component of the output signal at 70 falls into its own Fourier spectral bin. If there is a discontinuity in the endpoints, i.e. the signal does not transition smoothly from one period to the next, then the signal is non-coherent. In the case of a non-coherent signal, some of the energy level from each frequency component of the output signal at 70 "leaks" or "smears" into the other spectral bins, corrupting the other signal energy levels. For this reason, the FFT normally cannot be used on non-coherent signals without some form of pre-processing, i.e., windowing.

Windowing, however, has the unfortunate effect of spreading the energy of each signal component into adjacent spectral bins, thereby destroying the accuracy of AC tests. For this reason, test engineers usually restrict themselves to coherent sampling systems. Coherent and non-coherent multitone signals are illustrated in FIGS. 3a and 3b, respectively. One way of achieving coherence is to provide a common clock source 10 between the signal source 20 and the capture hardware 60 or 65. Although the sampling rates are not always set to the same frequency, in order for the signals to be coherent, the sampling rates should at least be related by a very precise ratio. The common clock source 10 is one method of ensuring that the sampling rates are synchronous.

The non-windowed Fourier transform of the signal in FIG. 3a is shown in FIG. 4a. As shown, each of the three test tones produces a response at a unique sine/cosine pair of the resulting spectrum. By comparison, the non-coherent waveform shown in FIG. 3b produces the smeared spectrum shown in FIG. 4b. Since each tone produces a response that spreads out over adjacent spectral bins, each tone corrupts the accuracy of the other tones. Additionally, since the energy of each tone is lost to adjacent bins, the energy at any given frequency bin do not accurately represent the signal level at that frequency. Also, in a non-coherent measurement system, the sine and cosine components at each test frequency corrupt each other.

In DSP-based measurement systems, the Fourier frequency $F_f$ is defined as the sampling frequency $F_s$ of the digitizer 60 divided by the total number of samples collected N. In a coherent DSP-based measurement system, each test frequency $Ft_n$ must be an integer multiple of the Fourier frequency $F_f$. Since coherence requires that each test frequency must be equal to the Fourier frequency times an integer, the minimum frequency resolution is always equal to the Fourier frequency. For example, if the Fourier frequency is equal to 100 Hz and a test frequency of 150 Hz is desired, the test engineer must choose either 100 Hz or 200 Hz. The alternative is to double the number of samples to achieve a Fourier frequency of 50 Hz, thus allowing a test frequency at 150 Hz. Doubling the number of samples also doubles the sample collection time, thereby increasing the cost of the test.

The disclosed system and method substantially maintains the accuracy of DSP-based performance evaluation measurements while freeing the test engineer from the sampling rate constraints and sample size requirements inherent to coherent DSP-based testing. This results in two very desirable benefits. First, the engineer is free to choose any sampling rate compatible with the signal bandwidth of the measurement to be performed. In the prior art DSP-based measurement system, the DUT output signal at 50 must contain only frequencies that are integer multiples of the Fourier frequency of the waveform digitizer 60. This often results in difficulty for the test engineer, since the sampling rate of the digitizer typically has limited programming flexibility. For example, a typical digitizer may only be programmable to a sampling rate of 20 MHz divided by an integer n. In this example, if a digitizer sampling rate of 15 MHz is required to maintain coherence with a desired input stimulus, then a coherent test system cannot be achieved.

The second benefit provided by the present embodiment is that the sample size is no longer related to the minimum frequency resolution of the input signal at 30. Since coherent systems require that each test tone must be an integer multiple of the Fourier frequency, the frequency resolution of the input signal at 30 (and by extension the output signal at 50) is inversely related to the number of samples collected. Stated another way, a fine resolution in frequency requires a large number of samples, which in turn requires a longer test time.

The preferred embodiment allows much faster measurements using non-coherent test signals with accuracy approaching that of slower, filly coherent test systems of the prior art. Using the digital signal processing based approach of the disclosed system to isolate the test signal energy levels at the various non-coherent test signal frequencies, the test engineer can quickly and accurately measure and/or calculate electrical test parameters such as gain, power supply rejection ratio (PSRR), common mode rejection ratio (CMRR), frequency response, harmonic distortion, signal to noise ratio (SNR), etc.

The preferred embodiment utilizes pseudo-coherent signals. A pseudo-coherent signal is one in which one or more individual frequency components are non-coherent, but whose frequencies are all known.

Figure 1A:
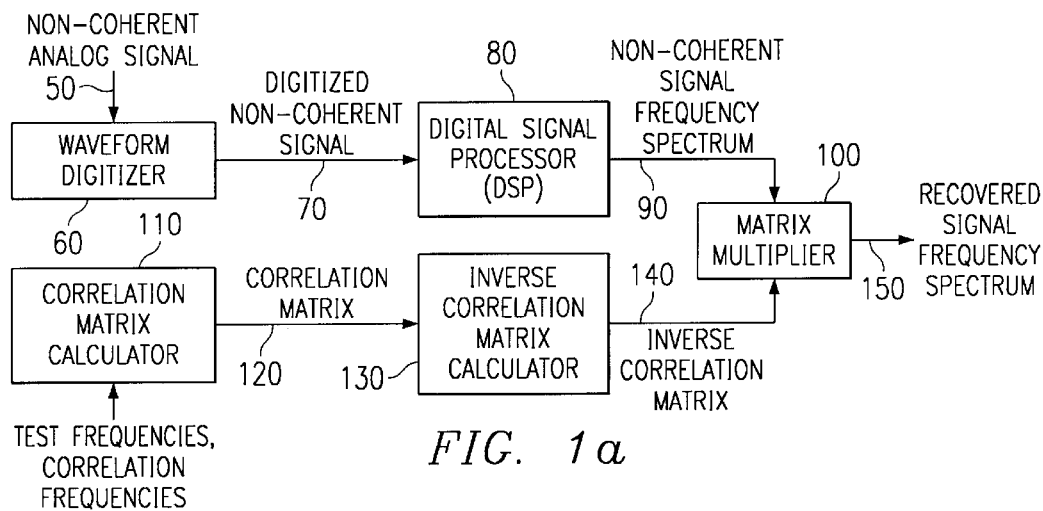
FIGS. 1(a) and 1(b) are block diagrams each showing one embodiment of the present invention.
Figure 1B:
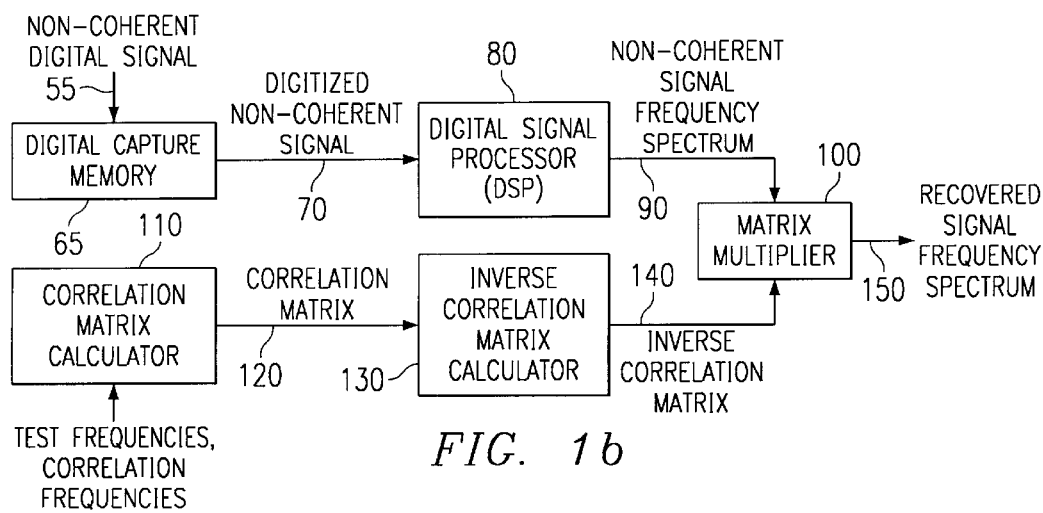

One embodiment of the present invention includes the digital signal processing based measurement system using pseudo-coherent digital signal processing as illustrated in FIG. 1(a). The digital signal processing based measurement system of FIG. 1(a) includes a waveform digitizer 60, a DSP 80, a test frequency correlation matrix processor 110, an inverse matrix processor 130, and a matrix multiplier 100. The sine and cosine levels at each test frequency are available at the output of the matrix multiplier 110. Another embodiment of the present invention using non-coherent digital signal processing, shown in FIG. 1(b) replaces the waveform digitizer 60 in FIG. 1(a) with a digital capture memory 65 for analog to digital converter testing (and for DSP-based testing of other circuits with digital outputs). Both embodiments of the measurement system of the present invention provide faster sampling systems in most cases than coherent digital signal processing systems of the prior art.

Consider the case of a single pseudo-coherent test tone with a frequency equal to 7.3 times the Fourier frequency $F_f$. The non-windowed FFT of this signal results in the smeared spectrum of FIG. 5, which is unusable in measuring the amplitude and phase of the pseudo-coherent test tone. The preferred embodiment advantageously uses two properties of the FFT. First, the FFT of a sum of two or more signals is equal to the sum of the FFT's of each individual signal.

Second, the FFT of any signal multiplied by a scaling factor A is equal to A times the FFT of the original unscaled signal. Using these properties of the FFT, it is possible to calculate the level of any sine wave at frequency Ft by precomputing the FFT of a unit amplitude sine wave at frequency Ft and then dividing any sine or cosine spectral bin of the FFT of the sine wave under test by the same sine or cosine spectral bin of the FFT of the unit amplitude sine wave. Similarly, it is possible to calculate the level of any cosine wave at frequency Ft by precomputing the FFT of a unit amplitude cosine wave at frequency Ft and then dividing any sine or cosine spectral bin of the FFT of the sine wave under test by the same sine or cosine spectral bin of the EFT of the unit amplitude cosine wave.

For a general single tone at an unknown phase, however, it is necessary to solve two equations in two unknowns to simultaneously measure both the sine and cosine components of the signal under test. Since the FFT of a sum of sine and cosine waves is equal to the sum of the FFT's of each sine and cosine wave, it follows that a multitone signal with N tones can be measured using 2N equations in 2N unknowns. Linear algebra (i.e. matrix mathematics) provides a very easy way to resolve multiple equations in multiple unknowns.

Since an FFT is an array of correlations between the input signal and a series of sine and cosine components at integer multiples of the Fourier frequency, the FFT can be replaced by individual correlation functions with a subset of correlation frequencies $Fc_1, Fc_2, Fc_3, \ldots Fc_n$. Since only one FFT spectral component is required for each sine or cosine component in the signal under test, it is not necessary to compute a full FFT. A set of correlation functions may provide a more efficient calculation to measure the spectral component at a limited number of frequencies. Using the correlation approach instead of the FFT approach also allows correlation frequencies $Fc_1, Fc_2, Fc_3, \ldots Fc_n$ that are not integer multiples of the Fourier frequency.

The FFT sine and cosine spectral components at a given frequency are proportional to the discrete time mathematical correlations between the signal under test and a sine and cosine wave at the given FFT spectral bin frequency. Ignoring the fixed scaling factor difference between an FFT and a correlation function, the real (cosine) and imaginary (sine) components of the FFT can be expressed as:

**Equation 1a:

$$\mathrm{Im}(FFT(Fc)) := \sum_i \sin\left(2 \cdot \pi \cdot \frac{Fc}{Ff} \cdot \frac{i}{N}\right) \cdot x(i)$$

**Equation 1b:

$$\mathrm{Re}(FFT(Fc)) := \sum_i \cos\left(2 \cdot \pi \cdot \frac{Fc}{Ff} \cdot \frac{i}{N}\right) \cdot x(i)$$

where Re(FFT(Fc))=cosine component at frequency Fc, Im(FFT(Fc))=sine component at frequency Fc, Ff=Fourier frequency of the sampling system, i ranges from 0 to N−1, N=number of samples in the digitized waveform, and x(i) is the signal under test. For a single pseudo-coherent test tone with both a sine and cosine component, the equation for x(i) is given by:

**Equation 2:

$$x(i) := S \cdot \sin\left(2 \cdot \pi \cdot \frac{Ft}{Ff} \cdot \frac{i}{N}\right) + C \cdot \cos\left(2 \cdot \pi \cdot \frac{Ft}{Ff} \cdot \frac{i}{N}\right)$$

combining equations 1a, 1b, and 2, the two equations in two unknowns for a single tone measurement can then be expressed as:

**Equation 3a:

$$\sum_i \sin\left(2 \cdot \pi \cdot \frac{Fc}{Ff} \cdot \frac{i}{N}\right) \cdot x(i) := S \cdot \sum_i \sin\left(2 \cdot \pi \cdot \frac{Fc}{Ff} \cdot \frac{i}{N}\right) \cdot \sin\left(2 \cdot \pi \cdot \frac{Ft}{Ff} \cdot \frac{i}{N}\right) + C \cdot \sum_i \sin\left(2 \cdot \pi \cdot \frac{Fc}{Ff} \cdot \frac{i}{N}\right) \cdot \cos\left(2 \cdot \pi \cdot \frac{Ft}{Ff} \cdot \frac{i}{N}\right)^{(3)}$$

**Equation 3b:

$$\sum_i \cos\left(2 \cdot \pi \cdot \frac{Fc}{Ff} \cdot \frac{i}{N}\right) \cdot x(i) := S \cdot \sum_i \cos\left(2 \cdot \pi \cdot \frac{Fc}{Ff} \cdot \frac{i}{N}\right) \cdot \sin\left(2 \cdot \pi \cdot \frac{Ft}{Ff} \cdot \frac{i}{N}\right) + C \cdot \sum_i \cos\left(2 \cdot \pi \cdot \frac{Fc}{Ff} \cdot \frac{i}{N}\right) \cdot \cos\left(2 \cdot \pi \cdot \frac{Ft}{Ff} \cdot \frac{i}{N}\right)^3$$

which can be rewritten for simplicity as:
**Equation 4a:

$$Ks := S \cdot Kss(Fc, Ft) + C \cdot Ksc(Fc, Ft)$$

**Equation 4b:

$$Kc := S \cdot Kcs(Fc, Ft) + C \cdot Kcc(Fc, Ft)$$

These two equations can be expressed as a simple matrix equation:

**Equation 5:

$$\begin{pmatrix} Ks \\ Kc \end{pmatrix} := \begin{pmatrix} Kss(Fc, Ft) & Ksc(Fc, Ft) \\ Kcs(Fc, Ft) & Kcc(Fc, Ft) \end{pmatrix} \cdot \begin{pmatrix} S \\ C \end{pmatrix}$$

which can be solved by simply computing the inverse of the correlation matrix:

**Equation 6:

$$\begin{pmatrix} S \\ C \end{pmatrix} := \begin{pmatrix} Kss(Fc, Ft) & Ksc(Fc, Ft) \\ Kcs(Fc, Ft) & Kcc(Fc, Ft) \end{pmatrix}^{-1} \cdot \begin{pmatrix} Ks \\ Kc \end{pmatrix}$$

It is important to realize that the inverse correlation matrix can be precomputed when the program is loaded to save test time, provided that the frequency Ft is known a priori. In a synchronous system, this requirement is automatically met, even if the test tone is non-coherent.

It is easy to extend this one-tone technique to multiple tones (including DC) by simply expanding the inverse correlation matrix:

**Equation 7:

$$\begin{pmatrix} S(Ft_1) \\ C(Ft_1) \\ S(Ft_2) \\ C(Ft_2) \\ \ldots \\ S(Ft_n) \\ C(Ft_n) \end{pmatrix} :=$$

$$\begin{pmatrix} Kss(1,1) & Ksc(1,1) & Kss(1,2) & Ksc(1,2) & \ldots & Kss(1,n) & Ksc(1,n) \\ Kcs(1,1) & Kcc(1,1) & Kcs(1,2) & Kcc(1,2) & \ldots & Kcs(1,n) & Kcc(1,n) \\ Kss(2,1) & Ksc(2,1) & Kss(2,2) & Ksc(2,2) & \ldots & Kss(2,n) & Ksc(2,n) \\ Kcs(2,1) & Kcc(2,1) & Kcs(2,2) & Kcc(2,2) & \ldots & Kcs(2,n) & Kcc(2,n) \\ \ldots & \ldots & \ldots & \ldots & \ldots & \ldots & \ldots \\ Kss(n,1) & Ksc(n,1) & Kss(n,2) & Ksc(n,2) & \ldots & Kss(n,n) & Ksc(2,n) \\ Kcs(n,1) & Kcc(n,1) & Kcs(n,2) & Kcc(n,2) & \ldots & Kcs(n,n) & Kcc(n,n) \end{pmatrix}^{-1} \cdot \begin{pmatrix} Ks(1) \\ Kc(1) \\ Ks(2) \\ Kc(2) \\ \ldots \\ Ks(n) \\ Kc(n) \end{pmatrix}$$

where

**Equation 8a-8d:

-continued $$Kss(a, b) := \sum_i \sin\left(2\cdot\pi\cdot\frac{Fc_a}{Ff}\cdot\frac{i}{N}\right)\cdot\sin\left(2\cdot\pi\cdot\frac{Ft_b}{Ff}\cdot\frac{i}{N}\right)$$

$$Ksc(a, b) := \sum_i \sin\left(2\cdot\pi\cdot\frac{Fc_a}{Ff}\cdot\frac{i}{N}\right)\cdot\cos\left(2\cdot\pi\cdot\frac{Ft_b}{Ff}\cdot\frac{i}{N}\right)$$

$$Kss(a, b) := \sum_i \cos\left(2\cdot\pi\cdot\frac{Fc_a}{Ff}\cdot\frac{i}{N}\right)\cdot\sin\left(2\cdot\pi\cdot\frac{Ft_b}{Ff}\cdot\frac{i}{N}\right)$$

$$Kcc(a, b) := \sum_i \cos\left(2\cdot\pi\cdot\frac{Fc_a}{Ff}\cdot\frac{i}{N}\right)\cdot\cos\left(2\cdot\pi\cdot\frac{Ft_b}{Ff}\cdot\frac{i}{N}\right)$$

\*\*Equation 9a-9b:

$$Ks(a) := \sum_i \sin\left(2\cdot\pi\cdot\frac{Fc_a}{Ff}\cdot\frac{i}{N}\right)\cdot x(i)$$

$$Kc(a) := \sum_i \cos\left(2\cdot\pi\cdot\frac{Fc_a}{Ff}\cdot\frac{i}{N}\right)\cdot x(i)$$

and N=number of samples collected, n=number of test tones, $Fc_1$, $Fc_2$, $Fc_3$, ... $Fc_n$=correlation frequencies (including DC at frequency 0) and $Ft_1$, $Ft_2$, $Ft_3$, ... $Ft_n$=pseudo-coherent test frequencies. $S(Ft_n)$ represents the nth sine component, and $C(Ft_n)$ represents the nth cosine component. The correlation frequency $Fc_1$ should be as close as possible to the test tone frequency $Ft_1$ to maximize the magnitude of the correlation between the test tone at $Ft_1$ and the unit amplitude sine and cosine functions at $Fc_1$. Maximum correlation yields better tolerance to noise, improving accuracy of the measurement. Likewise, $Fc_2$ should be as close as possible to $Ft_2$, etc. For this reason, it is sometimes advantageous to use correlation frequencies that are exactly equal to the test frequencies rather than using correlation frequencies that are integer multiples of the Fourier frequency $F_f$. The correlation frequencies $Fc_1$, $Fc_2$, ... $Fc_3$, $Fc_n$ must each be unique. Duplication of any Fc frequency will result in division by zero in the matrix multiplication.

As the number of test tones increases, it quickly becomes more efficient to compute a Fast Fourier Transform instead of individual correlation functions in Eq. 7. In this case, the values of Kss, Kcs, Ksc, Kcc, Ks and Kc in Eq. 7 are calculated using non-windowed FFT's instead of individual correlation functions. In this case, the constant scaling factor difference between the FFT and the correlation operation is cancelled mathematically. For this reason, the scaling factor can be ignored. In the case of FFT based correlations, the n closest spectral bins correspond to the correlation frequencies $Fc_1$, $Fc_2$, $Fc_3$, ... $Fc_n$.

One disadvantage of using the FFT to compute correlations is that the correlation frequencies $Fc_1$, $Fc_2$, $Fc_3$, ... $Fc_n$ are limited to integer multiples of the Fourier frequency $F_f$. However, one advantage of using only integer multiples of the Fourier frequency is that the DC component always has a zero correlation to all the non-zero Fc's, so DC offset can be ignored if it does not need to be measured. Using non-integer multiples of the Fourier frequency requires consideration of DC as a test tone with a frequency of 0.

It is worth noting that in the presence of a fully coherent signal under test, the inverse matrix of Eq. 7 reduces to the identity matrix, since the correlation between any coherent sine or cosine wave and any other coherent sine or cosine wave is zero. A fully coherent signal under test therefore yields the expected result that the amplitudes of each sine and cosine component are simply equal to the corresponding sine and cosine component of the non-windowed FFT.

A mixture of coherent and pseudo-coherent tones is perfectly acceptable using the disclosed method. In the case of two or more coherent test tones and corresponding coherent correlation frequencies, some of the correlation functions may reduce to zero. However, this fact does not cause any problems, so the disclosed system and method are perfectly useable with a mixed coherent/pseudo-coherent signal. Any correlation functions that can be precomputed based on known properties of the correlation frequencies and the test frequencies can help reduce test time, since these computations do not have to be performed for each device under test.

It is possible that unknown or unexpected frequencies, e.g. interference from a power source, may be present in the system. To determine if this is the case, the total power of the signal to be tested may be measured, and compared to the expected power measurement from the known frequencies. If there is a significant difference, it may be preferable to use other conventional methods to test the signal.

In the case of distortion, it is important to note that a device may produce more tones at the output than are applied at the input. As an example, a single tone applied to the input of a circuit under test may result in distortion at the output of the circuit under test. The distortion components are at known frequencies Ft*2, Ft*3, Ft*4, etc. Each significant output tone must be included in the matrix calculations if accuracy is to be maintained. Any unexpected tone that is not included in the matrix calculations will result in reduced accuracy. For this reason, it is advisable to calculate the total signal RMS and the combined signal RMS of all the measured test tones. If the residual difference between these two RMS values is sufficiently small, then the output of the circuit under test did not contain unexpected tones and the resulting measurement is valid. If the residual RMS (i.e. noise plus distortion) is large, then the measurement results must be considered a failure based on poor signal to noise ratio.

If some or all of the test tones at 70 are not properly synchronized with a common clock source 10, then the test frequencies $Ft_1$, $Ft_2$, $Ft_3$, ... $Ft_n$ will not be known a priori. These frequencies must then be computed before the matrix computations can proceed. The frequencies can be measured very accurately using a prior art digital signal processing technique published by Eric Rosenfeld at the 1986 International Test Conference, and described on pp. 213–218 of *DSP-Based Testing* by Matdiew Mahoney (1987).

The use of windowing techniques is compatible with the preferred embodiment. Windowing will allow increased accuracy in the presence of unpredictable interference tones which do not correspond to any of the test frequencies $F_t$. When using windowing, it is necessary to window all $F_t$ sine waves in equations 8a–8d with the same function used to window the test signal x(i) in equations 9a and 9b.

According to a disclosed class of innovative embodiments, there is provided a method of measuring a pseudo-coherent electrical signal having one or more sine and/or cosine components at n known signal frequencies $Ft_1$, $Ft_2$, ... $Ft_n$, comprising the steps of providing a digitized signal corresponding to said pseudo-coherent electrical signal, selecting a set of n correlation frequencies $Fc_1$, $Fc_2$, ... $Fc_n$, said correlation frequencies being substantially close to said signal frequencies $Ft_1$, $Ft_2$, ... $Ft_n$; computing a correlation matrix A of discrete time correlations between sampled unit amplitude sine and cosine waveforms at each of said correlation frequencies and sampled unit amplitude sine and cosine waveforms at each of said signal frequencies; computing the inverse of said correlation matrix, said inverse matrix represented by the notation $A^{-1}$; computing a matrix B of discrete time correlations between sampled unit amplitude sine and cosine waveforms at each of said correlation frequencies and said digitized signal, multiplication of $A^{-1}$ by B to produce a matrix C of sine and cosine amplitudes of said known frequencies of said pseudo-coherent signal.

According to another disclosed class of innovative embodiments, there is provided a method of measuring a non-coherent electrical signal, said electrical signal including one or more sine and/or cosine components at n known signal frequencies $Ft_1, Ft_2, \ldots Ft_n$, comprising the steps of: providing a digitized version of said non-coherent electrical signal, said digitized version represented by the notation $x(i)$; selecting a set of n correlation frequencies $Fc_1, Fc_2, \ldots Fc_n$, said correlation frequencies being substantially close to said signal frequencies $Ft_1, Ft_2, \ldots Ft_n$, DC offset represented by a cosine component at a frequency of 0; computing a 2n×2n matrix A of discrete time correlations between sampled unit amplitude sine and cosine waveforms at each of said correlation frequencies and sampled unit amplitude sine and cosine waveforms at each of said signal frequencies, said matrix defined by the equation:

$$A :=$$

$$\begin{pmatrix} Kss(1,1) & Ksc(1,1) & Kss(1,2) & Ksc(1,2) & \ldots & Kss(1,n) & Ksc(1,n) \\ Kcs(1,1) & Kcc(1,1) & Kcs(1,2) & Kcc(1,2) & \ldots & Kcs(1,n) & Kcc(1,n) \\ Kss(2,1) & Ksc(2,1) & Kss(2,2) & Ksc(2,2) & \ldots & Kss(2,n) & Ksc(2,n) \\ Kcs(2,1) & Kcc(2,1) & Kcs(2,2) & Kcc(2,2) & \ldots & Kcs(2,n) & Kcc(2,n) \\ \ldots & \ldots & \ldots & \ldots & \ldots & \ldots & \ldots \\ Kss(n,1) & Ksc(n,1) & Kss(n,2) & Ksc(n,2) & \ldots & Kss(n,n) & Ksc(2,n) \\ Kcs(n,1) & Kcc(n,1) & Kcs(n,2) & Kcc(n,2) & \ldots & Kcs(n,n) & Kcc(n,n) \end{pmatrix}$$

said discrete time correlations defined by the equations:

$$Kss(a,b) := \sum_i \sin\left(2\cdot\pi\cdot\frac{Fc_a}{Ff}\cdot\frac{i}{N}\right)\cdot\sin\left(2\cdot\pi\cdot\frac{Ft_b}{Ff}\cdot\frac{i}{N}\right)$$

$$Ksc(a,b) := \sum_i \sin\left(2\cdot\pi\cdot\frac{Fc_a}{Ff}\cdot\frac{i}{N}\right)\cdot\cos\left(2\cdot\pi\cdot\frac{Ft_b}{Ff}\cdot\frac{i}{N}\right)$$

$$Kcs(a,b) := \sum_i \cos\left(2\cdot\pi\cdot\frac{Fc_a}{Ff}\cdot\frac{i}{N}\right)\cdot\sin\left(2\cdot\pi\cdot\frac{Ft_b}{Ff}\cdot\frac{i}{N}\right)$$

$$Kcc(a,b) := \sum_i \cos\left(2\cdot\pi\cdot\frac{Fc_a}{Ff}\cdot\frac{i}{N}\right)\cdot\cos\left(2\cdot\pi\cdot\frac{Ft_b}{Ff}\cdot\frac{i}{N}\right)$$

where N is equal to the number of samples collected in said digitized non-coherent electrical signal and i ranges from 0 to N−1; computing the inverse of said correlation matrix, said inverse matrix represented by the notation $A^{-1}$; computing a 1×n matrix of discrete time correlations between sampled unit amplitude sine and cosine waveforms at each of said correlation frequencies and said digitized non-coherent electrical signal, said matrix defined by the equation:

$$B := \begin{pmatrix} Ks(1) \\ Kc(1) \\ Ks(2) \\ Kc(2) \\ \ldots \\ Ks(n) \\ Kc(n) \end{pmatrix}$$

said discrete time correlations defined by the equations:

$$Ks(a) := \sum_i \sin\left(2\cdot\pi\cdot\frac{Fc_a}{Ff}\cdot\frac{i}{N}\right)\cdot x(i)$$

$$Kc(a) := \sum_i \cos\left(2\cdot\pi\cdot\frac{Fc_a}{Ff}\cdot\frac{i}{N}\right)\cdot x(i)$$

where N is equal to the number of samples collected in said digitized non-coherent electrical signal, i ranges from 0 to N−1, and $x(i)$ represents said digitized samples of said non-coherent electrical signal; multiplication of said inverse matrix $A^{-1}$ by said matrix B to produce a matrix C of sine and cosine amplitudes of said non-coherent test tones, said matrix C defined by the equation:

$$C := \begin{pmatrix} S(Ft_1) \\ C(Ft_1) \\ S(Ft_2) \\ C(Ft_2) \\ \ldots \\ S(Ft_n) \\ C(Ft_n) \end{pmatrix}$$

where $S(Ftn)$ is equal to the sine amplitude of said non-coherent electrical signal at frequency Ftn and $C(Ftn)$ is equal to the cosine amplitude of said non-coherent electrical signal at frequency Ftn.

According to another disclosed class of innovative embodiments, there is provided a system for measuring non-coherent electrical signals, comprising a circuit under test; a signal generator which provides an analog multitone input signal to said circuit under test, said circuit under test producing an analog output signal; an analog wave-form digitizer responsive to said output signal, said digitizer sampling said output signal at a known sampling frequency $F_s$, said digitizer providing said digitized version of said non-coherent electrical signal; a common clock source providing a known frequency relationship between frequency components of said multitone input signal and said sampling frequency $F_s$.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

It should be noted that the AWG 20 may be replaced by a digital signal source for digital-to-analog converter testing. Similarly, the waveform digitizer 60 may be replaced by a digital capture memory 65, as is common in the case of analog-to-digital converter testing. The digital signal processing approach to testing gain, distortion, etc. as described in the present embodiment is the same in the case of a digital signal input or output as it is in the case of the pure analog signal input or output to or from the DUT 40. Since the preferred system and method are equally useful in all cases, the disclosed embodiments include the use of the various types of measurement systems.

It is also possible to use a two-stage testing system, wherein the incoming signal is first examined to determine whether or not the signal is coherent. If so, the signal is tested according to coherent testing methods. If not, the signal is tested using pseudo-coherent testing methods.

What is claimed is:

1. A method of measuring a pseudo-coherent electrical signal having one or more sine and/or cosine components at n known signal frequencies $Ft_1, Ft_2, \ldots Ft_n$, comprising the steps of:

providing a digitized signal corresponding to said pseudo-coherent electrical signal, selecting a set of n correlation frequencies $Fc_1, Fc_2, \ldots Fc_n$, said correlation frequencies being substantially close to said signal frequencies $Ft_1, Ft_2, \ldots Ft_n$;

computing a correlation matrix A of discrete time correlations between sampled unit amplitude sine and cosine waveforms at each of said correlation frequencies and sampled unit amplitude sine and cosine waveforms at each of said signal frequencies;

computing the inverse of said correlation matrix, said inverse matrix represented by the notation $A^{-1}$;

computing a matrix B of discrete time correlations between sampled unit amplitude sine and cosine waveforms at each of said correlation frequencies and said digitized signal, multiplication of $A^{-1}$ by B to produce a matrix C of sine and cosine amplitudes of said known frequencies of said pseudo-coherent signal.

2. The method of claim 1, wherein said matrices A and B are computed using a Fast Fourier Transform (FFT), said correlation frequencies $Fc_n$ each being equal to an integer multiple of the Fourier frequency Ff.

3. The method of claim 1, wherein the DC offset of said electrical signal is represented by a cosine component at a frequency of 0.

4. The method of claim 1, wherein one or more frequency component of said non-coherent electrical signal is coherent.

5. The method of claim 1, wherein one or more matrix operations are simplified due to known correlation values of 0.

6. The method of claim 1, wherein one or more frequencies $Ft_n$ are not known, said frequencies $Ft_n$ being determined using mathematical analysis of said digitized version of said non-coherent electrical signal.

7. The method of claim 1, wherein the correlation matrix $A^{-1}$ is computed prior collection of said digitized non-coherent electrical signal, said precomputation based on known values of said signal frequencies $Ft_1, Ft_2, \ldots Ft_n$.

8. The method of claim 1, wherein said non-coherent electrical signal comprises a single frequency component at $Ft_1$.

9. The method of claim 1, wherein said digitized version of non-coherent electrical signal is first multiplied by a windowing sequence w(i), according to the following equations:

$$\operatorname{Im}(FFT(Fc)) := \sum_i \sin\left(2 \cdot \pi \cdot \frac{Fc}{Ff} \cdot \frac{i}{N}\right) \cdot x(i) \cdot w(i)$$

$$\operatorname{Re}(FFT(Fc)) := \sum_i \cos\left(2 \cdot \pi \cdot \frac{Fc}{Ff} \cdot \frac{i}{N}\right) \cdot x(i) \cdot w(i)$$

and said discrete time correlations are replaced by windowed correlation functions using said windowing sequence w(i):

$$Kss(a, b) := \sum_i \sin\left(2 \cdot \pi \cdot \frac{Fc_a}{Ff} \cdot \frac{i}{N}\right) \cdot \sin\left(2 \cdot \pi \cdot \frac{Ft_b}{Ff} \cdot \frac{i}{N}\right) \cdot w(i)$$

$$Ksc(a, b) := \sum_i \sin\left(2 \cdot \pi \cdot \frac{Fc_a}{Ff} \cdot \frac{i}{N}\right) \cdot \cos\left(2 \cdot \pi \cdot \frac{Ft_b}{Ff} \cdot \frac{i}{N}\right) \cdot w(i)$$

$$Kcs(a, b) := \sum_i \cos\left(2 \cdot \pi \cdot \frac{Fc_a}{Ff} \cdot \frac{i}{N}\right) \cdot \sin\left(2 \cdot \pi \cdot \frac{Ft_b}{Ff} \cdot \frac{i}{N}\right) \cdot w(i)$$

$$Kcc(a, b) := \sum_i \cos\left(2 \cdot \pi \cdot \frac{Fc_a}{Ff} \cdot \frac{i}{N}\right) \cdot \cos\left(2 \cdot \pi \cdot \frac{Ft_b}{Ff} \cdot \frac{i}{N}\right) \cdot w(i).$$

10. A method of measuring a non-coherent electrical signal, said electrical signal including one or more sine and/or cosine components at n known signal frequencies $Ft_1, Ft_2, \ldots Ft_n$, comprising the steps of:

providing a digitized version of said non-coherent electrical signal, said digitized version represented by the notation x(i);

selecting a set of n correlation frequencies $Fc_1, Fc_2, \ldots Fc_n$, said correlation frequencies being substantially close to said signal frequencies $Ft_1, Ft_2, \ldots Ft_n$, DC offset represented by a cosine component at a frequency of 0;

computing a 2n×2n matrix A of discrete time correlations between sampled unit amplitude sine and cosine waveforms at each of said correlation frequencies and sampled unit amplitude sine and cosine waveforms at each of said signal frequencies, said matrix defined by the equation:

$$A := \begin{pmatrix} Kss(1,1) & Ksc(1,1) & Kss(1,2) & Ksc(1,2) & \ldots & Kss(1,n) & Ksc(1,n) \\ Kcs(1,1) & Kcc(1,1) & Kcs(1,2) & Kcc(1,2) & \ldots & Kcs(1,n) & Kcc(1,n) \\ Kss(2,1) & Ksc(2,1) & Kss(2,2) & Ksc(2,2) & \ldots & Kss(2,n) & Ksc(2,n) \\ Kcs(2,1) & Kcc(2,1) & Kcs(2,2) & Kcc(2,2) & \ldots & Kcs(2,n) & Kcc(2,n) \\ \ldots & \ldots & \ldots & \ldots & \ldots & \ldots & \ldots \\ Kss(n,1) & Ksc(n,1) & Kss(n,2) & Ksc(n,2) & \ldots & Kss(n,n) & Ksc(2,n) \\ Kcs(n,1) & Kcc(n,1) & Kcs(n,2) & Kcc(n,2) & \ldots & Kcs(n,n) & Kcc(n,n) \end{pmatrix}$$

said discrete time correlations defined by the equations:

$$Kss(a, b) := \sum_i \sin\left(2 \cdot \pi \cdot \frac{Fc_a}{Ff} \cdot \frac{i}{N}\right) \cdot \sin\left(2 \cdot \pi \cdot \frac{Ft_b}{Ff} \cdot \frac{i}{N}\right)$$

$$Ksc(a, b) := \sum_i \sin\left(2 \cdot \pi \cdot \frac{Fc_a}{Ff} \cdot \frac{i}{N}\right) \cdot \cos\left(2 \cdot \pi \cdot \frac{Ft_b}{Ff} \cdot \frac{i}{N}\right)$$

$$Kcs(a, b) := \sum_i \cos\left(2 \cdot \pi \cdot \frac{Fc_a}{Ff} \cdot \frac{i}{N}\right) \cdot \sin\left(2 \cdot \pi \cdot \frac{Ft_b}{Ff} \cdot \frac{i}{N}\right)$$

$$Kcc(a, b) := \sum_i \cos\left(2 \cdot \pi \cdot \frac{Fc_a}{Ff} \cdot \frac{i}{N}\right) \cdot \cos\left(2 \cdot \pi \cdot \frac{Ft_b}{Ff} \cdot \frac{i}{N}\right)$$

where N is equal to the number of samples collected in said digitized non-coherent electrical signal and i ranges from 0 to N−1;

computing the inverse of said correlation matrix, said inverse matrix represented by the notation $A^{-1}$;

computing a 1×n matrix of discrete time correlations between sampled unit amplitude sine and cosine waveforms at each of said correlation frequencies and said digitized non-coherent electrical signal, said matrix defined by the equation:

$$B := \begin{pmatrix} Ks(1) \\ Kc(1) \\ Ks(2) \\ Kc(2) \\ \ldots \\ Ks(n) \\ Kc(n) \end{pmatrix}$$

said discrete time correlations defined by the equations:

$$Ks(a) := \sum_i \sin\left(2 \cdot \pi \cdot \frac{Fc_a}{Ff} \cdot \frac{i}{N}\right) \cdot x(i)$$

$$Kc(a) := \sum_i \cos\left(2 \cdot \pi \cdot \frac{Fc_a}{Ff} \cdot \frac{i}{N}\right) \cdot x(i)$$

where N is equal to the number of samples collected in said digitized non-coherent electrical signal, i ranges from 0 to N−1, and x(i) represents said digitized samples of said non-coherent electrical signal; multiplication of said inverse matrix $A^{-1}$ by said matrix B to produce a matrix C of sine and cosine amplitudes of said non-coherent test tones, said matrix C defined by the equation:

$$C := \begin{pmatrix} S(Ft_1) \\ C(Ft_1) \\ S(Ft_2) \\ C(Ft_2) \\ \ldots \\ S(Ft_n) \\ C(Ft_n) \end{pmatrix}$$

where S(Ftn) is equal to the sine amplitude of said non-coherent electrical signal at frequency Ftn and C(Ftn) is equal to the cosine amplitude of said non-coherent electrical signal at frequency Ftn.

11. The method of claim 10, wherein said correlation matrices A and B are computed using a Fast Fourier Transform (FFT), said correlation frequencies $Fc_n$ each being equal to an integer multiple of the Fourier frequency Ff.

12. The method of claim 10, wherein the DC offset of said electrical signal is represented by a cosine component at a frequency of 0.

13. The method of claim 10, wherein one or more frequency component of said non-coherent electrical signal is coherent.

14. The method of claim 10, wherein one or more matrix operations are simplified due to known correlation values of 0.

15. The method of claim 10, wherein one or more frequencies $Ft_n$ are not known, said frequencies $Ft_n$ being determined using mathematical analysis of said digitized version of said non-coherent electrical signal.

16. The method of claim 10, wherein the correlation matrix $A^{-1}$ is computed prior to collection of said digitized non-coherent electrical signal, said precomputation based on known values of said signal frequencies $Ft_1, Ft_2, \ldots Ft_n$.

17. The method of claim 10, wherein said non-coherent electrical signal comprises a single frequency component at $Ft_1$.

18. The method of claim 10, wherein said digitized version of non-coherent electrical signal is first multiplied by a windowing sequence w(i), according to the following equations:

$$\operatorname{Im}(FFT(Fc)) := \sum_i \sin\left(2 \cdot \pi \cdot \frac{Fc}{Ff} \cdot \frac{i}{N}\right) \cdot x(i) \cdot w(i)$$

$$\operatorname{Re}(FFT(Fc)) := \sum_i \cos\left(2 \cdot \pi \cdot \frac{Fc}{Ff} \cdot \frac{i}{N}\right) \cdot x(i) \cdot w(i)$$

and said discrete time correlations are replaced by windowed correlation functions using said windowing sequence w(i):

$$Kss(a, b) := \sum_i \sin\left(2 \cdot \pi \cdot \frac{Fc_a}{Ff} \cdot \frac{i}{N}\right) \cdot \sin\left(2 \cdot \pi \cdot \frac{Ft_b}{Ff} \cdot \frac{i}{N}\right) \cdot w(i)$$

$$Ksc(a, b) := \sum_i \sin\left(2 \cdot \pi \cdot \frac{Fc_a}{Ff} \cdot \frac{i}{N}\right) \cdot \cos\left(2 \cdot \pi \cdot \frac{Ft_b}{Ff} \cdot \frac{i}{N}\right) \cdot w(i)$$

$$Kcs(a, b) := \sum_i \cos\left(2 \cdot \pi \cdot \frac{Fc_a}{Ff} \cdot \frac{i}{N}\right) \cdot \sin\left(2 \cdot \pi \cdot \frac{Ft_b}{Ff} \cdot \frac{i}{N}\right) \cdot w(i)$$

$$Kcc(a, b) := \sum_i \cos\left(2 \cdot \pi \cdot \frac{Fc_a}{Ff} \cdot \frac{i}{N}\right) \cdot \cos\left(2 \cdot \pi \cdot \frac{Ft_b}{Ff} \cdot \frac{i}{N}\right) \cdot w(i).$$

* * * * *